US012658885B2

(12) United States Patent
Fujii et al.

(10) Patent No.: US 12,658,885 B2
(45) Date of Patent: Jun. 16, 2026

(54) RESONATOR DEVICE AND METHOD OF MANUFACTURING RESONATOR DEVICE

(71) Applicant: SEIKO EPSON CORPORATION, Tokyo (JP)

(72) Inventors: Masahiro Fujii, Shiojiri (JP); Ryuichi Kurosawa, Suwa-gun Hara-mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 791 days.

(21) Appl. No.: 18/170,897

(22) Filed: Feb. 17, 2023

(65) Prior Publication Data

US 2023/0268904 A1     Aug. 24, 2023

(30) Foreign Application Priority Data

Feb. 21, 2022    (JP) ................................. 2022-025083

(51) Int. Cl.
*H03H 9/17*        (2006.01)
*H03H 3/02*        (2006.01)
*H03H 9/13*        (2006.01)

(52) U.S. Cl.
CPC .............. *H03H 9/173* (2013.01); *H03H 3/02* (2013.01); *H03H 2003/021* (2013.01); *H03H 9/13* (2013.01)

(58) Field of Classification Search
CPC ........ H03H 9/173; H03H 9/13; H03H 9/0519; H03H 9/0547; H03H 9/1021; H03H 9/10; H03H 9/02; H03H 9/215; H03H 2003/021; H03H 3/02; H03H 3/007
See application file for complete search history.

(56) References Cited

U.S. PATENT DOCUMENTS

| | | | | |
|---|---|---|---|---|
| 6,806,557 | B2 * | 10/2004 | Ding | ..................... B81B 7/0038 257/659 |
| 2008/0090074 | A1 | 4/2008 | Matsumura et al. | |
| 2011/0050046 | A1 | 3/2011 | Onitsuka et al. | |
| 2015/0130028 | A1 | 5/2015 | Asano et al. | |
| 2020/0252047 | A1 | 8/2020 | Fujii et al. | |

FOREIGN PATENT DOCUMENTS

| | | |
|---|---|---|
| JP | 2011-49665 A | 3/2011 |
| JP | 2011-60846 A | 3/2011 |
| JP | 2014-60699 A | 4/2014 |
| JP | 2017-118145 A | 6/2017 |
| JP | 2017-201660 A | 11/2017 |
| JP | 2020-123926 A | 8/2020 |
| WO | 2006/051727 A1 | 5/2006 |

* cited by examiner

*Primary Examiner* — Emily P Pham
(74) *Attorney, Agent, or Firm* — Rankin, Hill & Clark LLP

(57) ABSTRACT

A resonator device includes a base made of silicon and provided with a first surface and a second surface in a front-back relationship with each other, a resonator element arranged on the first surface, a lid which is made of silicon, which has a third surface arranged at the first surface side to be faced to the first surface, and a recessed part having a bottom surface and opening on the third surface, and the third surface of which is bonded to the first surface, and a getter layer which is arranged on the bottom surface of the recessed part, and which is provided with a gas adsorptive property, wherein the bottom surface of the recessed part is higher in surface roughness Ra than the third surface.

14 Claims, 10 Drawing Sheets

*FIG. 4*

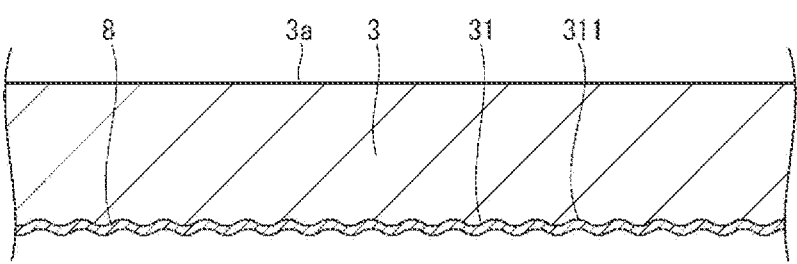

*FIG. 5*

```
┌─────────────────────────────┐      ┌─────────────────────────────────┐
│ LID PREPARATION STEP    ─S1  │      │ BASE PREPARATION STEP      ─S2   │
│                              │      │ ┌─────────────────────────┐     │
│                              │      │ │ INTEGRATED CIRCUIT      │ ─S21│
│                              │      │ │ FORMATION STEP          │     │
│                              │      │ └─────────────────────────┘     │
│ ┌────────────────────┐       │      │ ┌─────────────────────────┐     │
│ │ RECESSED PART      │ ─S11  │      │ │ BASE-SIDE BONDING LAYER │ ─S22│
│ │ FORMATION STEP     │       │      │ │ FORMATION STEP          │     │
│ └────────────────────┘       │      │ └─────────────────────────┘     │
│ ┌────────────────────┐       │      │ ┌─────────────────────────┐     │
│ │ GETTER LAYER       │ ─S12  │      │ │ RESONATOR ELEMENT       │ ─S23│
│ │ FORMATION STEP     │       │      │ │ MOUNTING STEP           │     │
│ └────────────────────┘       │      │ └─────────────────────────┘     │
└─────────────────────────────┘      └─────────────────────────────────┘
```

```
┌──────────────────────────────────┐
│ BONDING STEP              ─S3     │
│ ┌───────────────────────┐         │
│ │ POSITIONING STEP      │  ─S31   │
│ └───────────────────────┘         │
│ ┌───────────────────────┐         │
│ │ WAFER BONDING STEP    │  ─S32   │
│ └───────────────────────┘         │
│ ┌───────────────────────┐         │
│ │ BASE WAFER THINNING STEP│ ─S33  │
│ └───────────────────────┘         │
│ ┌───────────────────────┐         │
│ │ EXTERNAL TERMINAL     │  ─S34   │
│ │ FORMATION STEP        │         │
│ └───────────────────────┘         │
│ ┌───────────────────────┐         │
│ │ LID WAFER THINNING STEP│ ─S35   │
│ └───────────────────────┘         │
│ ┌───────────────────────┐         │
│ │ SEGMENTALIZATION STEP │  ─S36   │
│ └───────────────────────┘         │
└──────────────────────────────────┘

┌───────────────────────┐
│ ANNEALING STEP        │  ─S4
└───────────────────────┘
```

RESONATOR DEVICE AND METHOD OF MANUFACTURING RESONATOR DEVICE

The present application is based on, and claims priority from JP Application Serial Number 2022-025083, filed Feb. 21, 2022, the disclosure of which is hereby incorporated by reference herein in its entirety.

BACKGROUND

1. Technical Field

The present disclosure relates to a resonator device and a method of manufacturing a resonator device.

2. Related Art

An electronic device described in JP-A-2014-60699 (Document 1) has a package having a base body and a lid body bonded to each other, and a tuning fork quartz crystal element housed in a cavity of the package. Further, on an inner surface, namely a surface facing the cavity, of the lid body, there is arranged a storage metal film having a gas-storing property, namely a getter material. According to such a configuration, by the storage metal film adsorbing a gas generated when anodic-bonding the base body and the lid body to each other and a gas generated inside, it is possible to reduce pressure fluctuation in the cavity to thereby stabilize a characteristic of the electronic device on a long-term basis.

Here, in order to enhance the gas adsorption capability due to the storage metal film, it is effective to increase the surface area of the storage metal film. However, as the electronic device is reduced in size, it becomes difficult to keep the storage metal film large in surface area, and in the electronic device described in Document 1, it is difficult to exert a high gas adsorption capability.

SUMMARY

A resonator device according to the present disclosure includes a base made of silicon and provided with a first surface and a second surface in a front-back relationship with each other, a resonator element arranged on the first surface, a lid which is made of silicon, which has a third surface arranged at the first surface side to be faced to the first surface, and a recessed part having a bottom surface and opening on the third surface, and the third surface of which is bonded to the first surface, and a getter layer which is arranged on the bottom surface of the recessed part, and which is provided with a gas adsorptive property, wherein the bottom surface of the recessed part is higher in surface roughness Ra than the third surface.

A method of manufacturing a resonator device according to another aspect of the present disclosure is a method of manufacturing a resonator device having a base made of silicon and provided with a first surface and a second surface in a front-back relationship with each other, a resonator element arranged on the first surface, a lid which is made of silicon, which has a third surface arranged at the first surface side to be faced to the first surface, and a recessed part having a bottom surface and opening on the third surface, and the third surface of which is bonded to the first surface, and a getter layer which is arranged on the bottom surface of the recessed part, and which is provided with a gas adsorptive property, the method including a recessed part formation step of forming the recessed part provided with the bottom surface higher in surface roughness Ra than the third surface, a getter layer formation step of forming the getter layer on the bottom surface of the recessed part, and a bonding step of bonding the third surface of the lid to the first surface of the base.

BRIEF DESCRIPTION OF THE DRAWINGS

FIG. 4 is a partial enlarged cross-sectional view of the lid.

FIG. 5 is a flowchart showing a manufacturing process of the resonator device.

DESCRIPTION OF AN EXEMPLARY EMBODIMENT

A preferred embodiment of a resonator device and a method of manufacturing a resonator device will hereinafter be described based on the accompanying drawings.

First Embodiment

Figure 1:
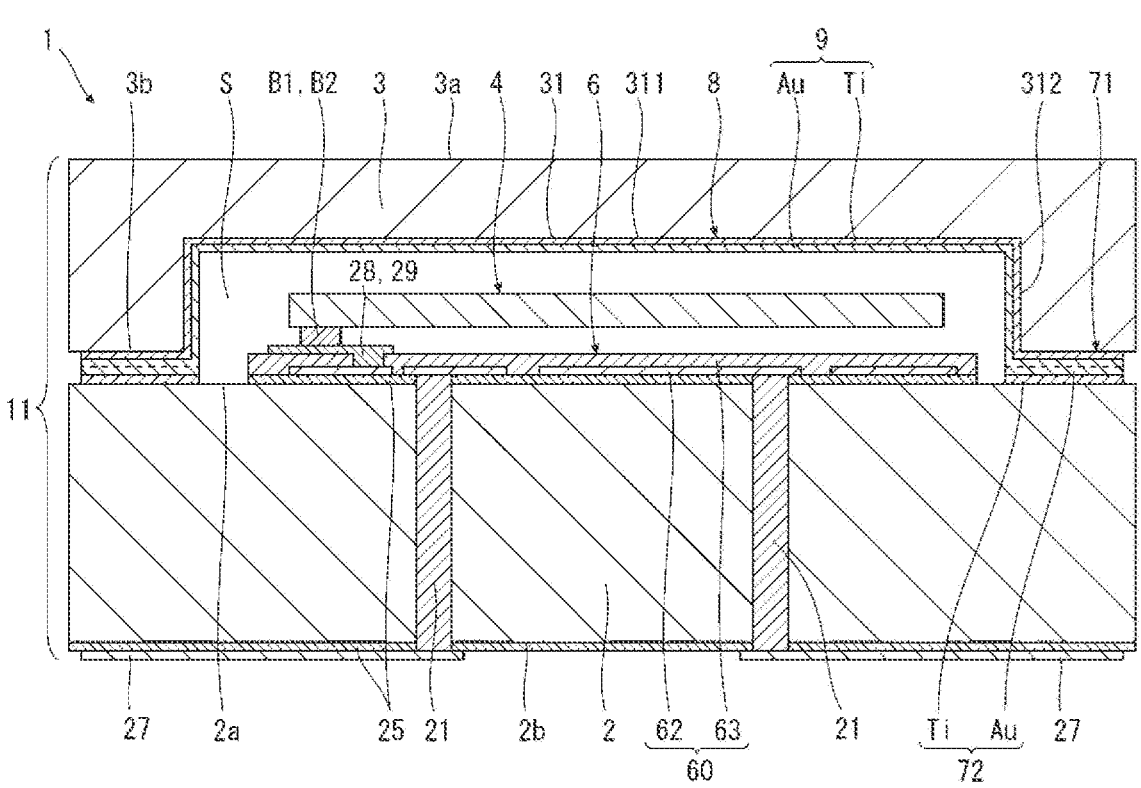
FIG. 1 is a cross-sectional view of a resonator device according to a first embodiment.
Figures 2, 3:
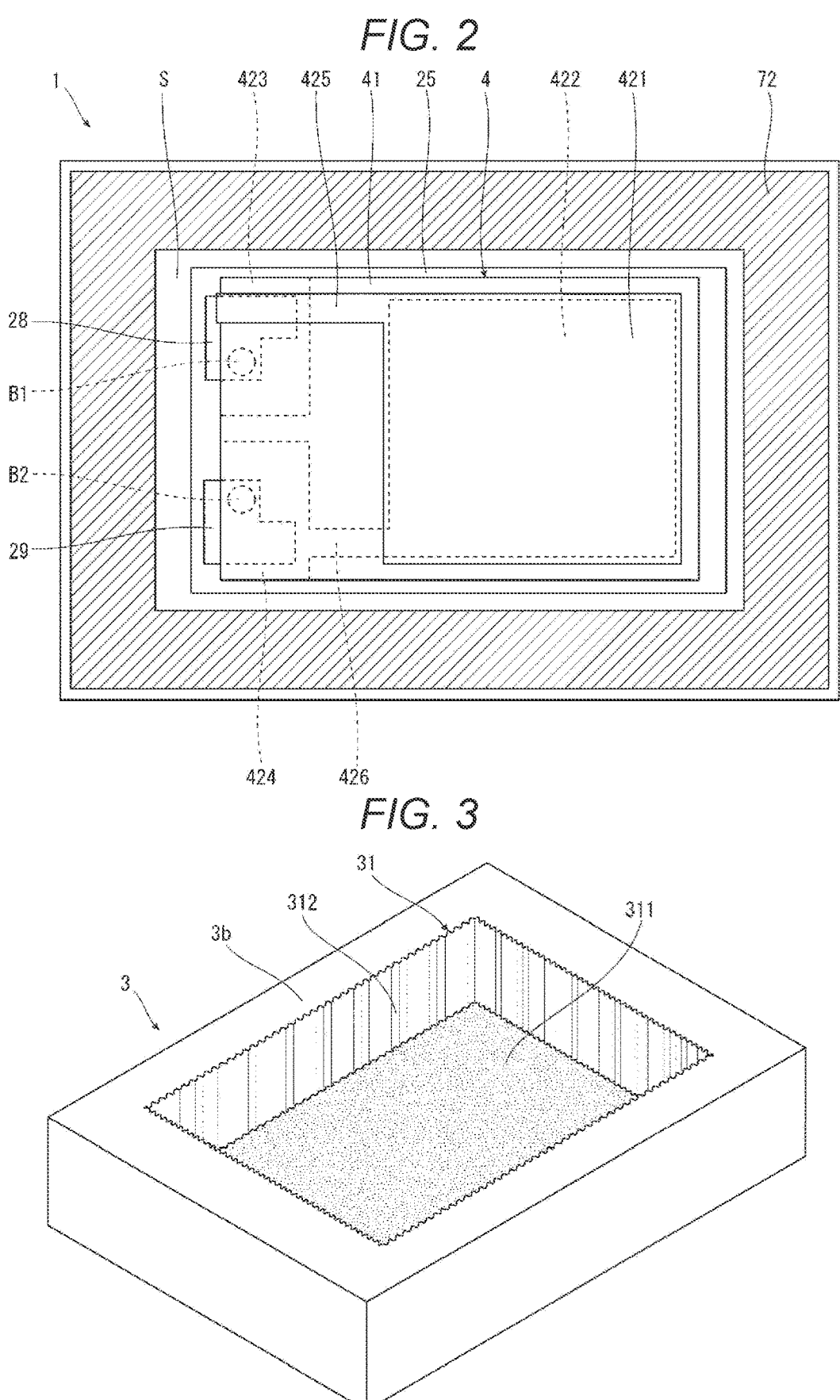
FIG. 2 is a plan view showing a resonator element provided to the resonator device.
FIG. 3 is a perspective view showing an inside of a recessed part of a lid provided to the resonator device.

FIG. 1 is a cross-sectional view of a resonator device according to a first embodiment. FIG. 2 is a plan view showing a resonator element provided to the resonator device. FIG. 3 is a perspective view showing an inside of a recessed part of a lid provided to the resonator device. FIG. 4 is a partial enlarged cross-sectional view of the lid. FIG. 5 is a flowchart showing a manufacturing process of the resonator device. FIG. 6 through FIG. 19 are each a cross-sectional view showing a method of manufacturing the resonator device. It should be noted that an upper side in each of FIG. 1, FIG. 4, and FIG. 6 through FIG. 19 is also referred to as an "upper side," and a lower side thereof is also referred to as a "lower side" for the sake of convenience of explanation. In that case, in FIG. 2, a front side in the sheet corresponds to the "upper side," and a back side corresponds to the "lower side." Further, in FIG. 3, an upper side corresponds to the "lower side," and a lower side corresponds to the "upper side."

The resonator device 1 shown in FIG. 1 is a quartz crystal oscillator. The resonator device 1 has a package 11 provided with a housing part S formed inside, and a resonator element 4 housed in the housing part S. The housing part S is made airtight, and is set in a reduced-pressure state, and preferably, in a state more approximate to a vacuum state. Therefore, the viscosity resistance decreases, and the oscillation characteristic of the resonator element 4 is improved. Further, the package 11 has a base 2 to which the resonator element 4 is installed, and a lid 3 bonded to an upper surface 2a of the base 2 so as to cover the resonator element 4.

Base 2

The base 2 is a silicon substrate. Further, the base 2 has an upper surface 2a as a first surface and a lower surface 2b as a second surface, wherein the upper surface 2a and the lower surface 2b are in a front-back relationship with each other. Further, an insulating film 25 is formed on each of the upper surface 2a and the lower surface 2b. Further, at the upper surface 2a side of the base 2, there is formed an integrated circuit 6 electrically coupled to the resonator element 4. By forming the integrated circuit 6 on the base 2, it is possible to make effective use of the base 2, and it is possible to achieve reduction in size of the resonator device 1. In particular, by forming the integrated circuit 6 at the upper surface 2a side, it is possible to house the integrated circuit 6 in the housing part S to protect the integrated circuit 6. It should be noted that the integrated circuit 6 can be formed at the lower surface 2b side, or can be omitted.

The integrated circuit 6 includes a temperature sensor, an oscillation circuit, and a temperature compensation circuit. The temperature sensor is a sensor for detecting the temperature of the resonator element 4. The oscillation circuit is electrically coupled to the resonator element 4, and oscillates the resonator element 4 by amplifying an output signal of the resonator element 4 and then feeding back the signal thus amplified to the resonator element 4. Further, the temperature compensation circuit performs temperature compensation so that a frequency variation of the output signal becomes smaller than the frequency-temperature characteristic of the resonator element 4 itself based on temperature information output from the temperature sensor. It should be noted that the configuration of the integrated circuit 6 is not particularly limited.

On the upper surface 2a of the base 2, there is formed a stacked body 60 of a wiring layer 62 and an insulating layer 63. Further, a plurality of active elements which is formed on the upper surface 2a and is not shown is electrically coupled via interconnections included in the wiring layer 62, and thus, the integrated circuit 6 is formed. Further, on the stacked body 60, there are arranged a pair of interconnections 28, 29 for electrically coupling the resonator element 4 and the integrated circuit 6 to each other. In contrast, on the lower surface 2b of the base 2, there is arranged a plurality of external terminals 27, and these external terminals 27 are electrically coupled to the integrated circuit 6 via through electrodes 21 penetrating the base 2 in the thickness direction, respectively.

Resonator Element 4

As shown in FIG. 2, the resonator element 4 has a vibrating substrate 41, and electrodes arranged on a surface of the vibrating substrate 41. The vibrating substrate 41 has a thickness-shear vibration mode, and is formed of an AT-cut quartz crystal substrate in the present embodiment. Since the AT-cut quartz crystal substrate has a third-order frequency-temperature characteristic, the resonator element 4 having an excellent temperature characteristic is achieved. Further, the electrodes include an excitation electrode 421 arranged on an upper surface of the vibrating substrate 41, an excitation electrode 422 arranged on a lower surface so as to be opposed to the excitation electrode 421, a pair of terminals 423, 424 arranged on the lower surface, an interconnection 425 for electrically coupling the terminal 423 and the excitation electrode 421 to each other, and an interconnection 426 for electrically coupling the terminal 424 and the excitation electrode 422 to each other.

It should be noted that the configuration of the resonator element 4 is not limited to the configuration described above. For example, the resonator element 4 can be provided with a mesa structure in which a vibration area sandwiched between the excitation electrodes 421, 422 protrudes from the periphery of the vibration area, or can also be provided with an inverted-mesa structure in which the vibration area is recessed from the periphery of the vibration area in an opposite manner. Further, a bevel treatment for grinding the periphery of the vibrating substrate 41, or a convex treatment for changing the upper surface and the lower surface to a convex surface can be provided.

Further, the resonator element 4 is not limited to one vibrating in the thickness-shear vibration mode, and can be one having a plurality of vibrating arms making a flexural vibration in an in-plane direction such as a tuning-fork resonator element. In other words, the vibrating substrate 41 is not limited to one formed of the AT-cut quartz crystal substrate, and can also be formed of a quartz crystal substrate other than the AT-cut quartz crystal substrate such as an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate.

Further, the constituent material of the vibrating substrate 41 is not limited to the quartz crystal, but it is possible for the vibrating substrate 41 to be formed of a piezoelectric single-crystal body made of, for example, lithium niobate, lithium tantalate, lithium tetraborate, langasite crystal, potassium niobate, or gallium phosphate, or to be formed of a piezoelectric single-crystal body made of other materials than these. Furthermore, the resonator element 4 is not limited to the piezoelectrically-actuated resonator element, but can be an electrostatically-actuated resonator element using an electrostatic force.

Such a resonator element 4 is bonded to the upper surface 2a of the base 2 via a pair of metal bumps B1, B2, and at the same time, electrically coupled to the interconnections 28, 29.

Lid 3

The lid 3 is a silicon substrate similarly to the base 2. Thus, the base 2 and the lid 3 become equal in linear expansion coefficient to each other to prevent the thermal stress caused by the thermal expansion from occurring, and thus, the resonator device 1 having excellent vibration characteristics is achieved. Further, since it is possible to form the resonator device 1 with the semiconductor process, the resonator device 1 can accurately be manufactured, and at the same time, it is possible to achieve reduction in size thereof.

Further, as shown in FIG. 1, the lid 3 has an upper surface 3a, a lower surface 3b as a third surface, and a recessed part 31 which has a bottom, opens on the lower surface 3b, and houses the resonator element 4 inside. Among these constituents, the lower surface 3b is formed of a smooth surface (a mirror surface). Further, inner surfaces, namely a bottom surface 311 and a side surface 312, of the recessed part 31 are each formed of an uneven surface. In particular, as shown in FIG. 3, the bottom surface 311 is formed of a nano-porous uneven surface, and the side surface 312 is formed of an uneven surface with vertical streaks.

Further, the lid 3 is provided with a metal layer 9 formed throughout the inner surfaces of the recessed part 31 and the lower surface 3b. A portion located on the lower surface 3b of the metal layer 9 functions as a lid-side bonding layer 71 to be used for bonding to the base 2, and a portion located on the inner surfaces of the recessed part 31 function as a getter layer 8 which adsorbs (stores) a residual gas in the housing part S. By the getter layer 8 adsorbing the residual gas in the housing part S, deterioration in vacuum in the housing part S is prevented, and it is possible to effectively prevent deterioration of the vibration characteristic caused by a fluctuation in vibration frequency, deterioration in Q-value, and so on. In other words, it is possible to stabilize the vibration characteristic of the resonator device 1 on a long-term basis. Further, by integrally forming the lid-side bonding layer 71 and the getter layer 8 from the single metal layer 9, it is possible to achieve simplification of the manufacturing process of the resonator device 1, and thus, it is possible to reduce a manufacturing cost.

The metal layer 9 is formed of a stacked body of a Ti layer (a titanium layer) deposited on the lid 3, and an Au layer (a gold layer) deposited on the Ti layer. The Ti layer functions as a foundation layer which enhance adhesiveness between the lid 3 and the Au layer. Further, in the getter layer 8, by titanium atoms in the Ti layer being diffused in the Au layer, it is possible to exert a gas adsorptive property.

The thickness of the Ti layer is not particularly limited, but is preferably, for example, no smaller than 0.01 nm and no larger than 50 nm, and more preferably no smaller than 10 nm and no larger than 50 nm. The thickness of the Ti layer in the present embodiment is about 40 nm. By making the Ti layer have the thickness described above, it is possible to more surely exert a function as the foundation layer and a function as the getter layer 8 while preventing an excessive increase in film thickness.

Further, the thickness of the Au layer is not particularly limited, but is preferably, for example, no smaller than 5 nm and no larger than 100 nm, and more preferably no smaller than 10 nm and no larger than 30 nm. The thickness of the Au layer in the present embodiment is about 20 nm. By making the Au layer have the thickness described above, it is possible to more surely perform bonding to the base 2 in the lid-side bonding layer 71, and at the same time, it becomes easy for the titanium atoms to be diffused in the getter layer 8 up to the surface of the Au layer, and thus, it is possible to exert an excellent gas adsorptive property.

Such a lid 3 is bonded to the upper surface 2a of the base 2 via the lid-side bonding layer 71. As a bonding counterpart of the lid-side bonding layer 71, a base-side bonding layer 72 faced to the lid-side bonding layer 71 is formed on the upper surface 2a of the base 2. Similarly to the lid-side bonding layer 71, the base-side bonding layer 72 is formed of a stacked body of a Ti layer deposited on the upper surface 2a, and an Au layer deposited on the Ti layer.

As the bonding described above, there is used surface activated bonding. Specifically, the base 2 and the lid 3 are bonded to each other at room temperature by irradiating the surfaces of the lid-side bonding layer 71 and the base-side bonding layer 72 with an ion beam or plasma, making the surfaces adhere to each other in a state in which the surfaces of the lid-side bonding layer 71 and the base-side bonding layer 72 are activated, and then diffusing and then reorganizing the metal in the lid-side bonding layer 71 and the base-side bonding layer 72. According to such a bonding method, since the bonding can be achieved at room temperature, it is difficult to generate a gas when performing bonding, and thus, it is possible to realize highly airtight sealing. Further, residual stress is difficult to occur. It should be noted that the bonding method of the base 2 and the lid 3 is not particularly limited.

Here, as described above, while the lower surface 3b of the lid 3 is formed of a smooth surface (a mirror surface), the inner surfaces, namely the bottom surface 311 and the side surface 312, of the recessed part 31 are each formed of the uneven surface. In other words, the bottom surface 311 and the side surface 312 are each higher in surface roughness Ra than the lower surface 3b. Thus, the following advantages can be obtained. It should be noted that the surface roughness Ra means arithmetic mean roughness.

In order to more firmly bond the lid-side bonding layer 71 and the base-side bonding layer 72 to each other with the surface activated bonding described above, it is necessary to make the surfaces of the lid-side bonding layer 71 and the base-side bonding layer 72 smooth and then make the surfaces adhere to each other. Therefore, in the present embodiment, the lower surface 3b and the upper surface 2a are made as low in surface roughness Ra as possible by a polishing or the like. Thus, it is possible to suppress the surface roughness of the lid-side bonding layer 71 and the base-side bonding layer 72 deposited respectively on the lower surface 3b and the upper surface 2a to a low level, and thus, the adhesiveness between these layers is enhanced to make it possible to firmly bond these layers to each other. It should be noted that the surface roughness Ra of the lower surface 3b and the upper surface 2a is not particularly limited, but is preferably lower than 5 nm, and is more preferably lower than 3 nm. Thus, it is possible to suppress the surface roughness of the lid-side bonding layer 71 and the base-side bonding layer 72 to a sufficiently low level, and it is possible to more firmly bond the lid 3 and the base 2 to each other.

In contrast, in order to enhance the function of the getter layer 8, it is effective to make the surface area of the getter layer 8 larger. However, due to a reduction in size of the resonator device 1, it is made difficult to ensure the large surface area of the getter layer 8. Therefore, in the resonator device 1, both of the bottom surface 311 and the side surface 312 of the recessed part 31 are made as uneven surfaces to raise the surface roughness Ra of the bottom surface 311 and the side surface 312. Further, the asperity of the bottom surface 311 and the side surface 312 is transferred on the surface of the getter layer 8 by depositing the getter layer 8 on the bottom surface 311 and the side surface 312, and thus, the surface of the getter layer 8 is provided with the asperate shape as shown in FIG. 4. Therefore, it is possible to increase the surface area of the getter layer 8, and thus, the getter layer 8 can exert the high adsorption capability. According to such a configuration, it is possible to increase the surface area while suppressing planar spread of the getter layer 8. Therefore, it is possible to achieve both of the reduction in size of the resonator device 1 and the increase in surface area of the getter layer 8. It should be noted that the surface roughness Ra of the bottom surface 311 and the side surface 312 is not particularly limited, but is preferably higher than 200 nm, and is more preferably higher than 300 nm. Thus, the advantage described above becomes more conspicuous.

In the present embodiment, the recessed part 31 is formed by metal-assisted chemical etching (MACE). The metal-assisted chemical etching is a technique in which the silicon substrate is vertically etched following the pattern of a catalytic substance such as gold (Au) or silver (Ag) by dipping a silicon substrate provided with the catalytic substance formed in etching areas in an etching liquid to selectively etch only silicon immediately below the catalytic substance due to the local reaction promotion by the catalytic substance. In particular, in the present embodiment, in order to efficiently supply the etching liquid to an interface between the catalytic substance and the silicon substrate, the catalytic substance is provided with a number of microscopic through holes. Therefore, a difference in etching rate occurs between an area overlapping the through hole and an area not overlapping the through hole, and as a result, the bottom surface 311 having a nano-porous asperity due to the etching traces is naturally obtained. Further, by the through holes overlapping an outer edge of the catalytic substance, the shape of the outer edge is distorted, and thus, the streaky asperity is naturally obtained on the side surface 312 of the recessed part 31. As described above according to the metal-assisted chemical etching, it is possible to easily form the bottom surface 311 and the side surface 312 having the asperity.

It should be noted that as a technique capable of vertically etching the silicon substrate similarly to the metal-assisted chemical etching, there is known dry etching. However, in the dry etching, since greenhouse gases are generated, an environmental load is apt to become heavy. In contrast, according to the metal-assisted chemical etching, since no greenhouse gas is generated, the environmental load can be suppressed to a low level.

The resonator device 1 is hereinabove described. As described above, such a resonator device 1 has the base 2 which is made of silicon, and which is provided with the upper surface 2a as the first surface and the lower surface 2b as the second surface wherein the upper surface 2a and the lower surface 2b are in the front-back relationship with each other, the resonator element 4 which is arranged on the upper surface 2a, the lid 3 which is made of silicon, and which is provided with the lower surface 3b as the third surface arranged at the upper surface 2a side and faced to the upper surface 2a, and the recessed part 31 having the bottom, and opening on the lower surface 3b, and in which the lower surface 3b is bonded to the upper surface 2a, and the getter layer 8 arranged on the bottom surface 311 of the recessed part 31 and provided with the gas adsorptive property, and the bottom surface 311 of the recessed part 31 is higher in surface roughness Ra than the lower surface 3b. Thus, the asperity of the bottom surface 311 is transferred to the surface of the getter layer 8, and the surface of the getter layer 8 becomes to have the asperate shape, and therefore, it is possible to make the surface area large. Therefore, it is possible for the getter layer 8 to exert the high gas adsorption capability. According to such a configuration, it is possible to achieve both of the reduction in size of the resonator device 1 and the increase in surface area of the getter layer 8.

Further, as described above, the surface roughness Ra of the bottom surface 311 of the recessed part 31 is higher than 200 nm. Thus, it is possible to make the surface area of the getter layer 8 sufficiently large, and thus, it is possible to exert the high gas adsorptive property.

Further, as described above, the getter layer 8 is provided with the Ti layer arranged on the bottom surface 311 and the Au layer arranged on the Ti layer. Thus, the configuration of the getter layer 8 is simplified. Further, it becomes easy to integrally form the getter layer 8 and the lid-side bonding layer 71 with each other.

Further, as described above, the thickness of the Au layer is no larger than 100 nm. Thus, it is possible to more surely perform bonding to the base 2 in the lid-side bonding layer 71, and at the same time, it becomes easy for the titanium atoms to be diffused in the getter layer 8 up to the surface of the Au layer, and thus, it is possible to exert an excellent gas adsorptive property.

Further, as described above, the resonator device 1 has the lid-side bonding layer 71 which is arranged on the lower surface 3b, and is used for bonding to the base 2, and the getter layer 8 and the lid-side bonding layer 71 are the same in configuration as each other. Thus, it is possible to integrally form the getter layer 8 and the lid-side bonding layer 71 with each other.

Further, as described above, the surface roughness Ra of the lower surface 3b is lower than 5 nm. Thus, it is possible to make the surface of the lid-side bonding layer 71 arranged on the lower surface 3b sufficiently smooth. Therefore, it is possible to achieve an increase in bonding strength with the base 2.

Then, a method of manufacturing the resonator device 1 will be described. As shown in FIG. 5, the method of manufacturing the resonator device 1 includes a lid preparation step S1 of preparing the lid 3 on which the metal layer 9 is deposited, a base preparation step S2 of preparing the base 2 on which the resonator element 4 is mounted, and a bonding step S3 of bonding the base 2 and the lid 3 to each other, and an annealing step S4 of performing an anneal treatment.

Lid Preparation Step S1

As shown in FIG. 5, the lid preparation step S1 includes a recessed part formation step S11 of providing the lid part 31 to the lid 3, and a getter layer formation step S12 of providing the getter layer 8 to the lid 3.

Recessed Part Formation Step S11

Figure 6:
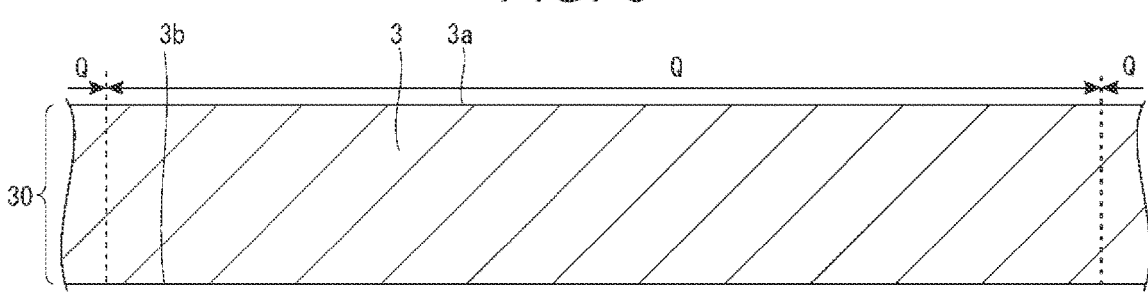
FIG. 6 is a cross-sectional view showing a method of manufacturing the resonator device.

Firstly, as shown in FIG. 6, a lid wafer 30 to be a base material of the lid 3 is prepared. The lid wafer 30 is provided with the upper surface 3a and the lower surface 3b in the front-back relationship with each other, and includes a plurality of segmentalization areas Q, namely a plurality of parts which is segmentalized into the lids 3. Then, the lid wafer 30 is washed. It should be noted that in this state, the thickness of the lid wafer 30 is thicker than a thickness required for the lid 3. Thus, it is possible to increase the strength of the lid wafer 30, and thus, easiness in handling during the manufacture is enhanced.

Figure 7:
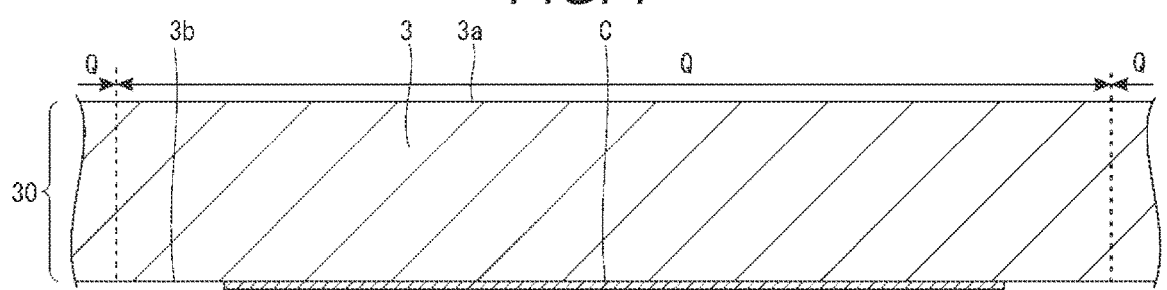
FIG. 7 is a cross-sectional view showing the method of manufacturing the resonator device.
Figure 8:
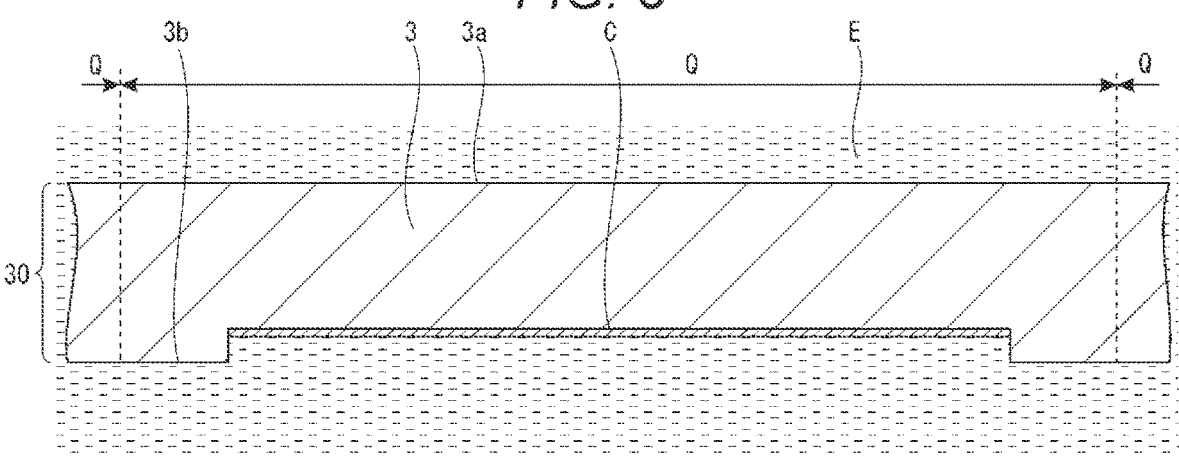
FIG. 8 is a cross-sectional view showing the method of manufacturing the resonator device.

Then, the recessed part 31 is formed on the lower surface 3b of each of the lids 3 using the metal-assisted chemical etching. Specifically, first, as shown in FIG. 7, a catalytic substance C is formed on the lower surface 3b of each of the lids 3. Then, as shown in FIG. 8, the lid wafer 30 is dipped in an etching liquid E to selectively etch only the silicon immediately below the catalytic substance C. Due to the process described hereinabove, each of the lids 3 is provided with the recessed part 31 provided with the inner surfaces higher in surface roughness Ra of the asperity than the lower surface 3b. As described above, according to the metal-assisted chemical etching, it is possible to more surely form the recessed part 31 provided with the asperate inner surfaces. Therefore, for example, a treatment of roughening surfaces such as a blast treatment becomes unnecessary after the etching processing, and it is possible to achieve reduction in formation step of the recessed part 31.

Getter Layer Formation Step S12

Figure 9:
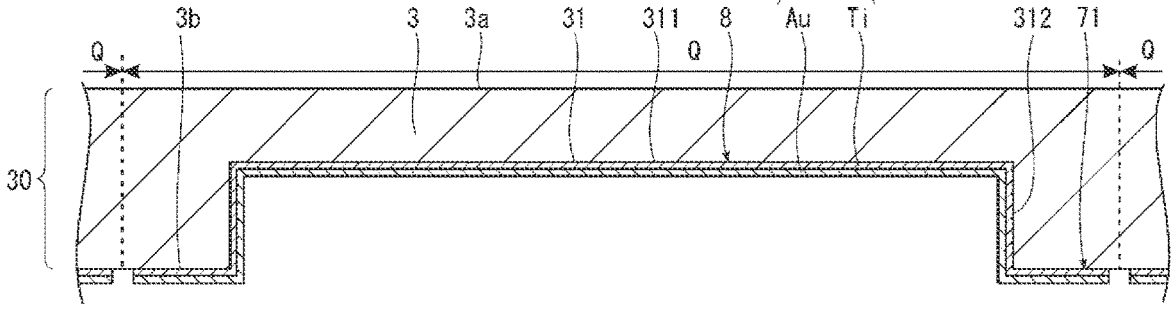
FIG. 9 is a cross-sectional view showing the method of manufacturing the resonator device.

Then, as shown in FIG. 9, the Ti layer and the Au layer are deposited in sequence to form the metal layer 9 on the lower surface 3*b* of each of the lids 3 and the inner surfaces of the recessed part 31 of each of the lids 3. A portion located on the lower surface 3*b* of the metal layer 9 is the lid-side bonding layer 71 to be used for bonding to the base 2, and a portion located on the inner surfaces of the recessed part 31 are the getter layer 8 which adsorbs a residual gas in the housing part S. It should be noted that the deposition method of the metal layer 9 is not particularly limited, and there can be used sputtering, CVD, vapor deposition, and so on.

Here, as described above, since the bottom surface 311 and the side surface 312 of the recessed part 31 are both formed as the uneven surfaces, the asperity is also transferred to the surface of the getter layer 8, and the surface of the getter layer 8 is provided with the asperate shape. Therefore, the getter layer 8 becomes large in surface area, and can exert the high gas adsorption capability.

It should be noted that the thickness of the Au layer deposited in the present step is not particularly limited, but is preferably, for example, no smaller than 5 nm and no larger than 100 nm, and more preferably no smaller than 10 nm and no larger than 30 nm. The thickness of the Au layer in the present embodiment is about 20 nm. By making the Au layer have the thickness described above, it is possible to more surely perform bonding to the base 2 in the lid-side bonding layer 71, and at the same time, it becomes easy for the titanium atoms to be dispersed in the getter layer 8 up to the surface of the Au layer, and thus, it is possible to exert an excellent gas adsorptive property.

Base Preparation Step S2

As shown in FIG. 5, the base preparation step S2 includes an integrated circuit formation step S21 of forming the integrated circuit 6, a base-side bonding layer formation step S22 of forming the base-side bonding layer 72, and a resonator element mounting step S23 of mounting the resonator element 4.

Integrated Circuit Formation step S21

Figure 10:
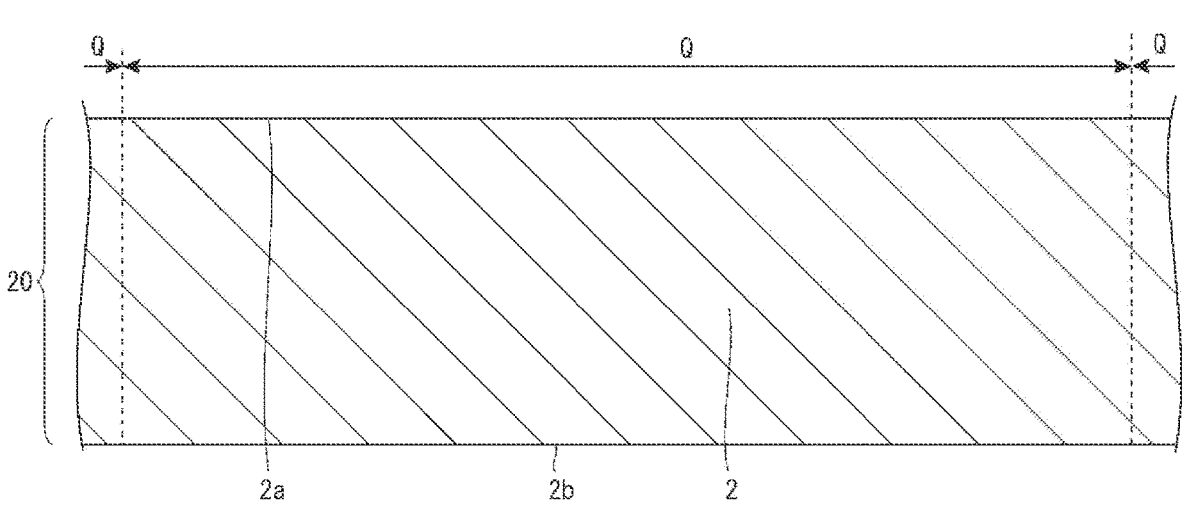
FIG. 10 is a cross-sectional view showing the method of manufacturing the resonator device.
Figure 11:
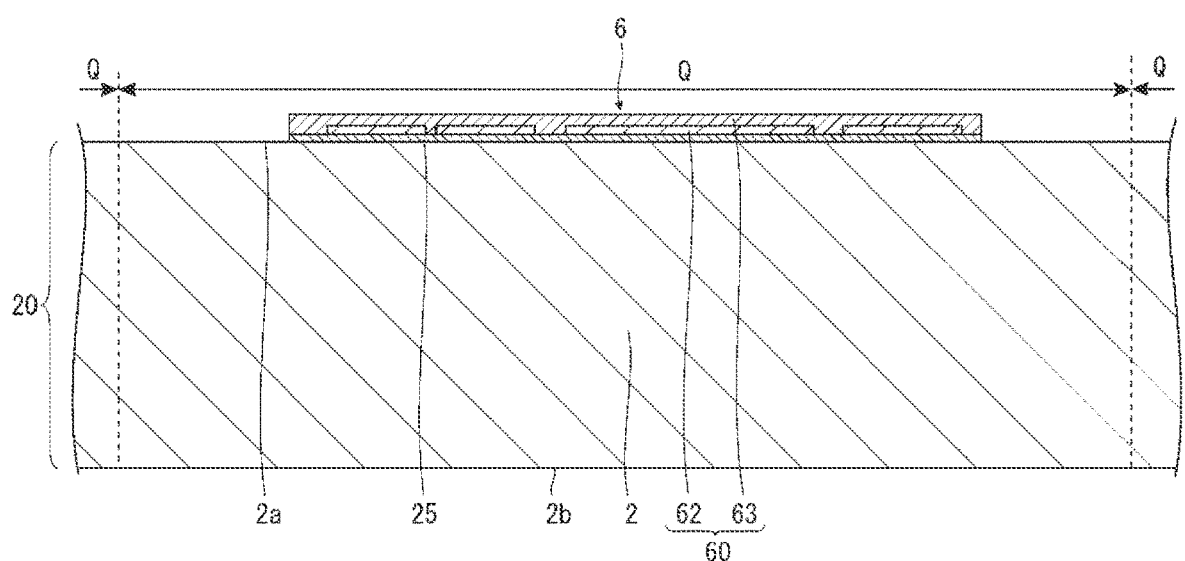
FIG. 11 is a cross-sectional view showing the method of manufacturing the resonator device.

Firstly, as shown in FIG. 10, a base wafer 20 to be a base material of the base 2 is prepared. The base wafer 20 is provided with the upper surface 2*a* and the lower surface 2*b* in the front-back relationship with each other, and includes a plurality of segmentalization areas Q, namely a plurality of parts which turns to the bases 2. It should be noted that in this state, the thickness of the base wafer 20 is thicker than a thickness required for the base 2. Thus, it is possible to increase the strength of the base wafer 20, and thus, easiness in handling during the manufacture is enhanced. Subsequently, as shown in FIG. 11, the integrated circuit 6 is formed on the upper surface 2*a* of each of the bases 2.

Base-Side Bonding Layer Formation Step S22

Figure 12:
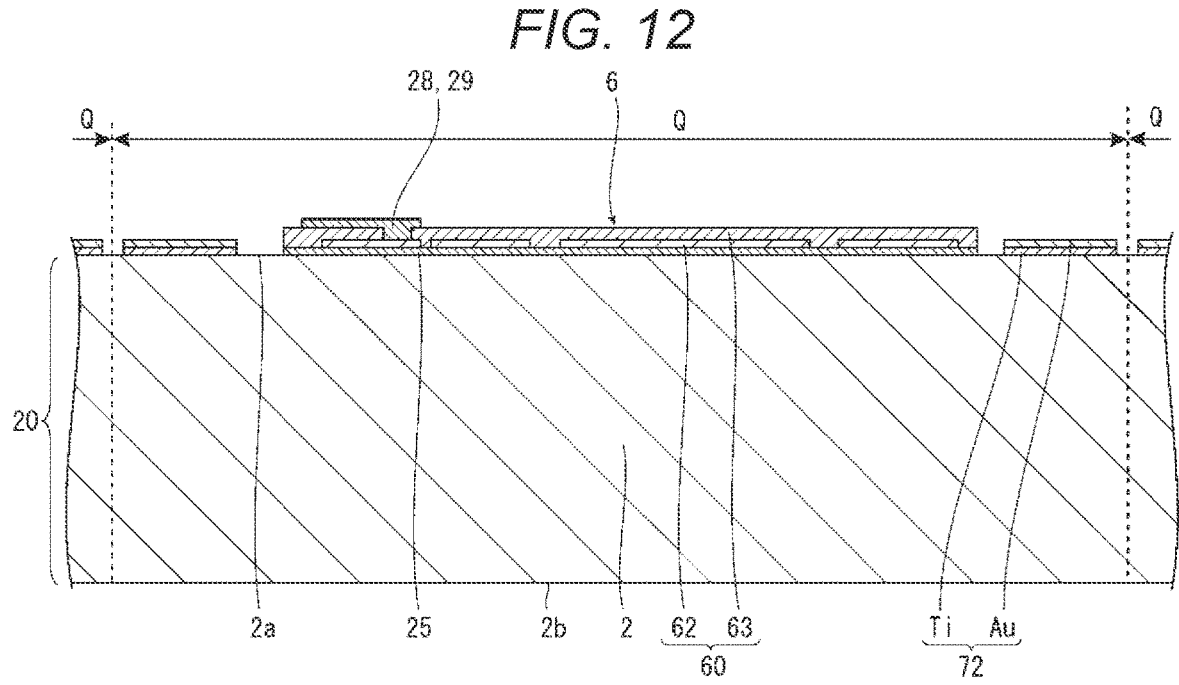
FIG. 12 is a cross-sectional view showing the method of manufacturing the resonator device.

Then, as shown in FIG. 12, the Ti layer and the Au layer are deposited in sequence on the upper surface 2*a* of each of the bases 2, and then performing patterning on the film thus deposited using etching to thereby form the base-side bonding layer 72 and the interconnections 28, 29. As described above, by forming the base-side bonding layer 72 and the interconnections 28, 29 in a lump in the same step, it is possible to achieve the simplification of the manufacturing process of the resonator device 1.

Resonator Element Mounting Step S23

Figure 13:
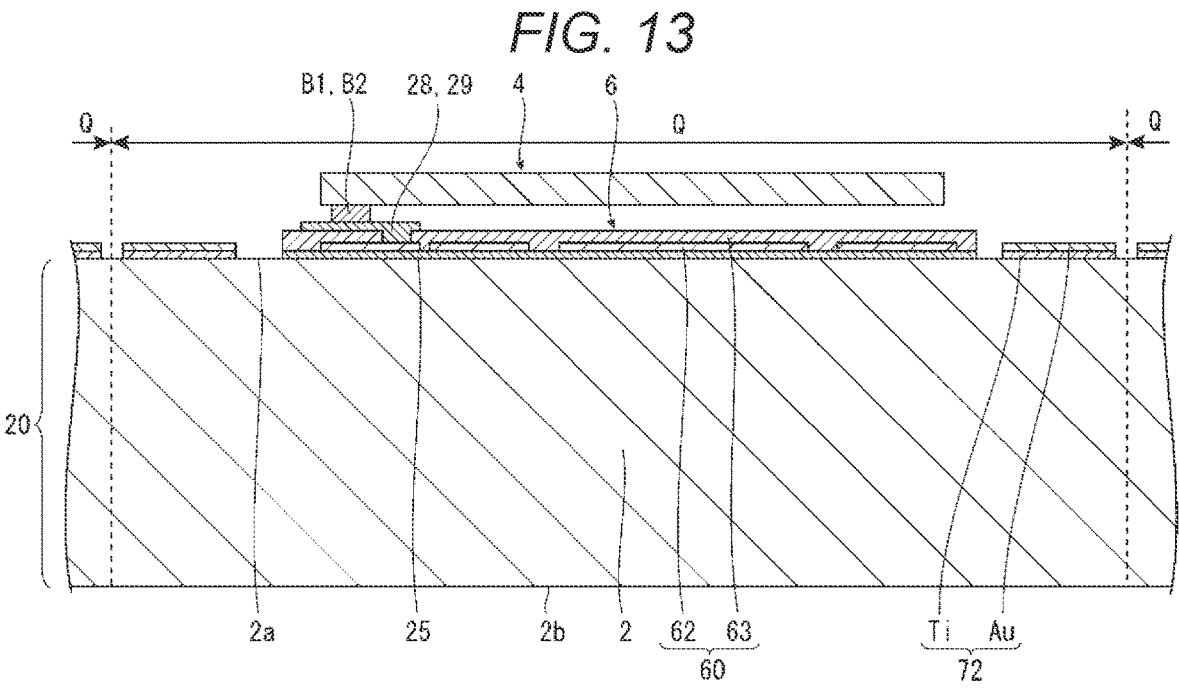
FIG. 13 is a cross-sectional view showing the method of manufacturing the resonator device.

Then, as shown in FIG. 13, the resonator element 4 is mounted on the upper surface 2*a* of the base 2 via the metal bumps B1, B2.

Bonding Step S3

As shown in FIG. 5, the bonding step S3 includes an alignment step S31 of performing alignment of the base wafer 20 and the lid wafer 30, a wafer bonding step S32 of bonding the base wafer 20 and the lid wafer 30 to each other, a base wafer thinning step S33 of reducing the plate thickness of the base wafer 20, an external terminal formation step S34 of forming the external terminals 27 on the lower surface 2*b* of each of the bases 2, a lid wafer thinning step S35 of reducing the plate thickness of the lid wafer 30, and a segmentalization step S36 of segmentalizing the segmentalization areas Q.

Alignment Step S31

Figure 14:
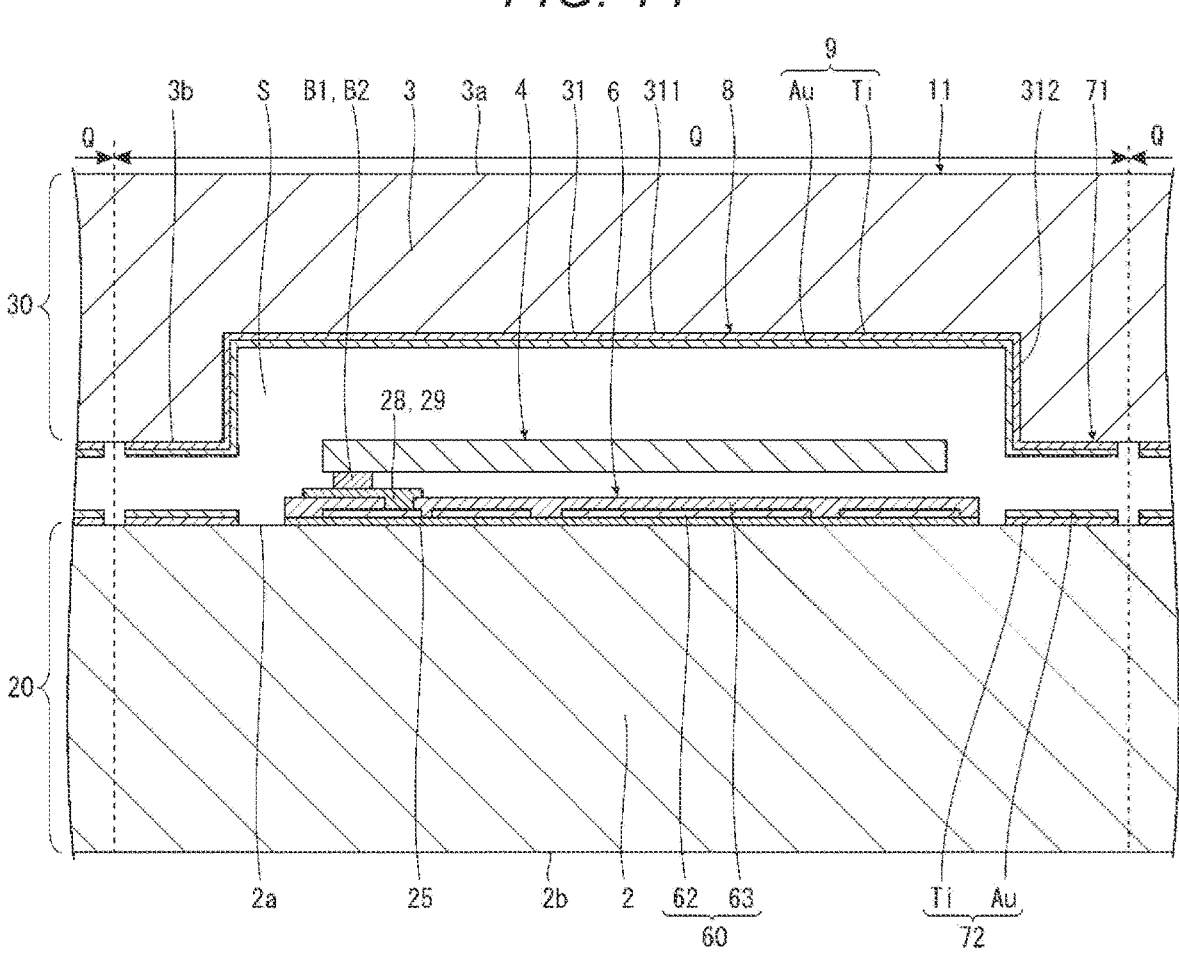
FIG. 14 is a cross-sectional view showing the method of manufacturing the resonator device.

First, as shown in FIG. 14, an alignment between the base wafer 20 and the lid wafer 30 is performed in vacuum using an IR camera or the like.

Wafer Bonding Step S32

Figure 15:
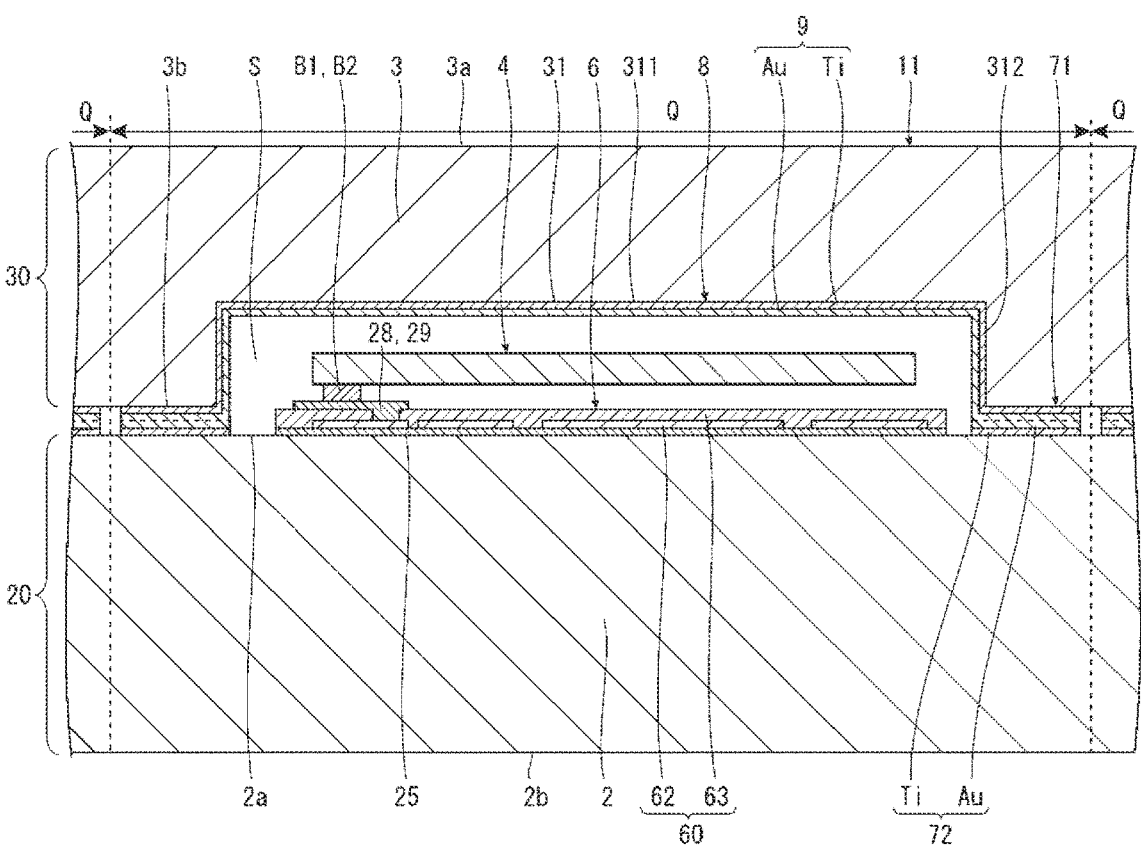
FIG. 15 is a cross-sectional view showing the method of manufacturing the resonator device.

Then, as shown in FIG. 15, by bonding the lid-side bonding layer 71 and the base-side bonding layer 72 to each other in vacuum using the surface activated bonding, the base wafer 20 and the lid wafer 30 are firmly bonded to each other. Specifically, the base 2 and the lid 3 are bonded to each other at room temperature by irradiating the surfaces of the lid-side bonding layer 71 and the base-side bonding layer 72 with an ion beam or plasma, making the surfaces adhere to each other in the state in which the surfaces of the lid-side bonding layer 71 and the base-side bonding layer 72 are activated, and then dispersing and then reorganizing the metal in the lid-side bonding layer 71 and the base-side bonding layer 72. According to such a bonding method, it is difficult to generate a gas when performing bonding, and thus, it is possible to realize highly airtight sealing. It should be noted that when performing bonding, the base wafer 20 and the lid wafer 30 can be pressurized, but are not required to be pressurized.

It should be noted that the surface roughness Ra of the lower surface 3*b* and the upper surface 2*a* is not particularly limited, but is preferably lower than 5 nm, and is more preferably lower than 3 nm. Thus, it is possible to suppress the surface roughness of the lid-side bonding layer 71 and the base-side bonding layer 72 to a sufficiently low level, and it is possible to more firmly bond the base wafer 20 and the lid wafer 30 to each other.

Base Wafer Thinning Step S33

Figure 16:
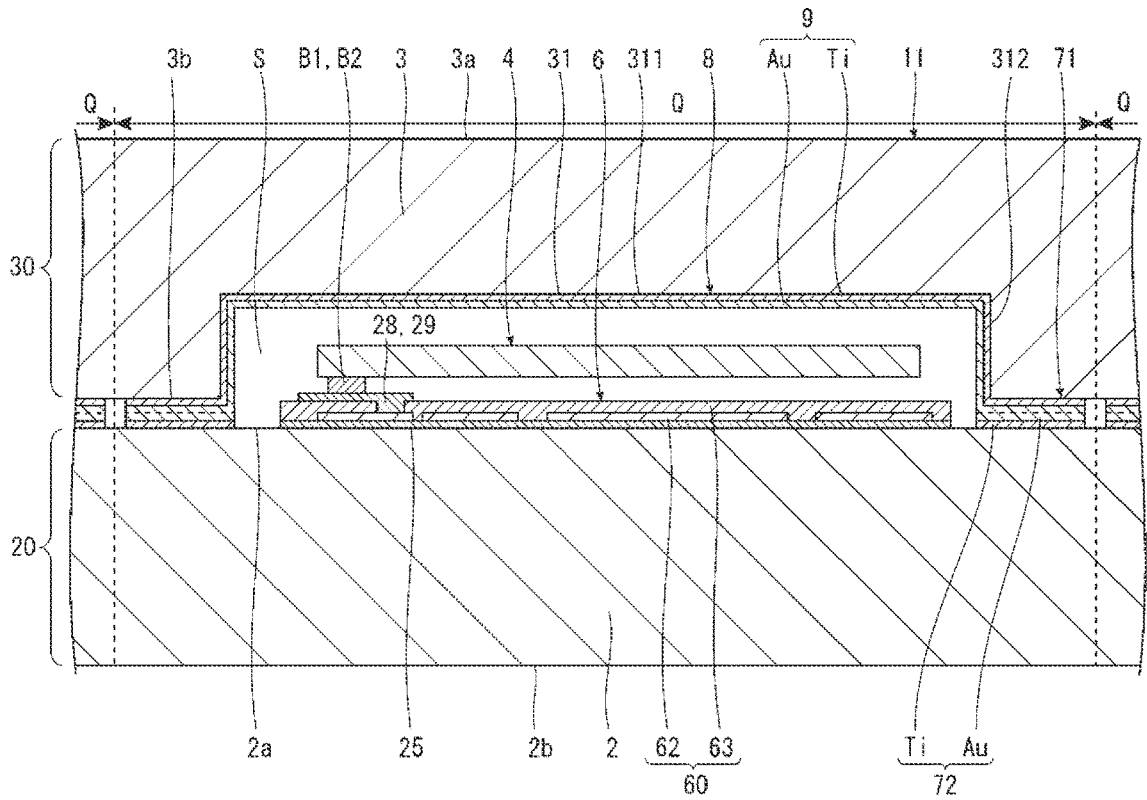
FIG. 16 is a cross-sectional view showing the method of manufacturing the resonator device.

Then, as shown in FIG. 16, the base wafer 20 is reduced in plate thickness from the lower surface 2*b* side to be coordinated with the thickness required for the base 2. The reduction in plate thickness can be achieved by, for example, chemical mechanical polishing (CMP). As described above, by keeping the base wafer 20 thick until the necessity arises, easiness in handling during the manufacture is enhanced.

External Terminal Formation Step S34

Figure 17:
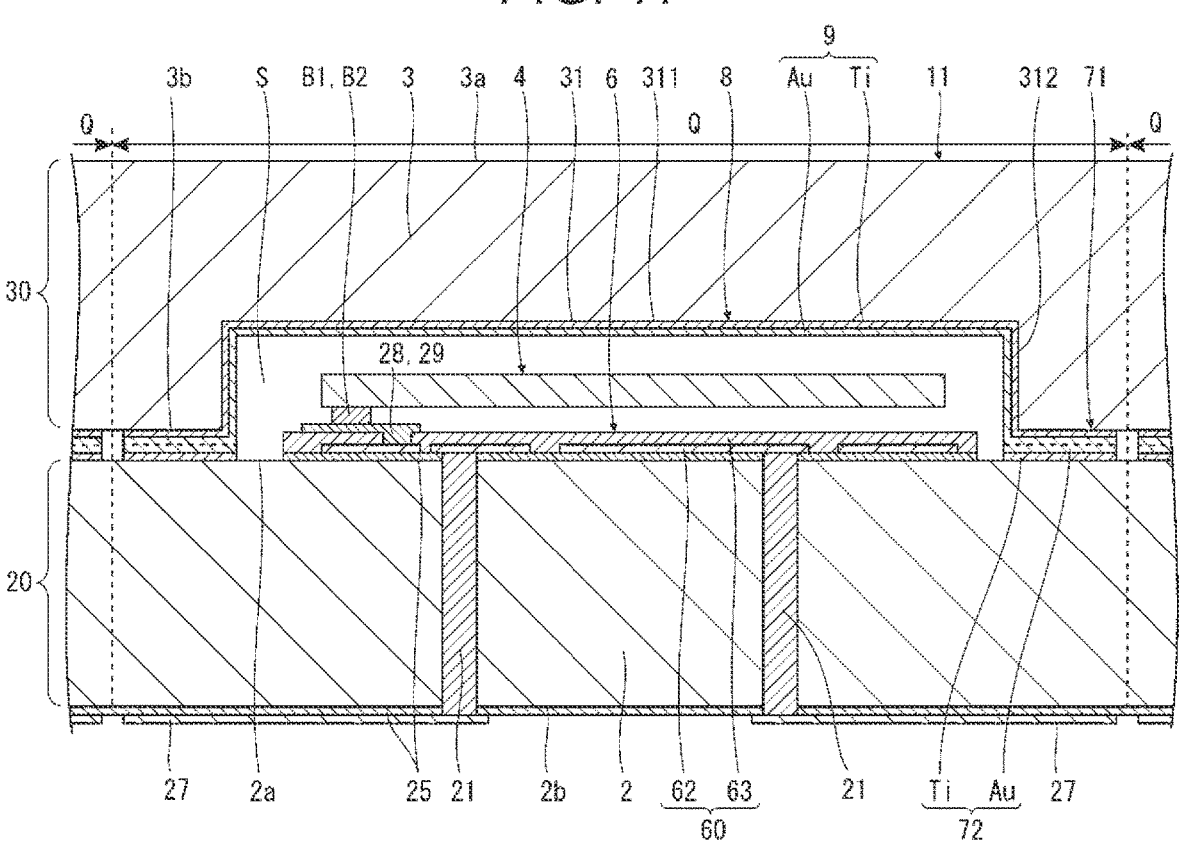
FIG. 17 is a cross-sectional view showing the method of manufacturing the resonator device.

Then, as shown in FIG. 17, the through electrodes 21 penetrating each of the bases 2 are formed, and further, the external terminals 27 are formed on the lower surface 2*b*.

Lid Wafer Thinning Step S35

Figure 18:
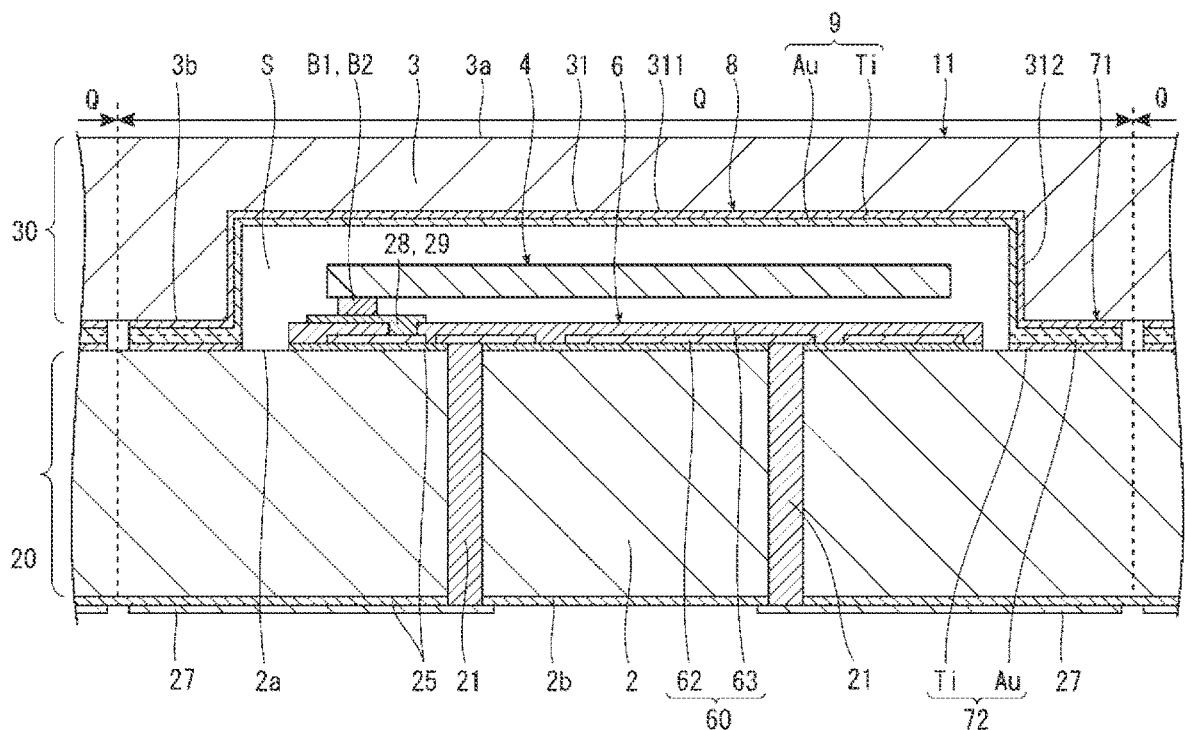
FIG. 18 is a cross-sectional view showing the method of manufacturing the resonator device.

Then, as shown in FIG. 18, the lid wafer 30 is reduced in plate thickness from the upper surface 3*a* side to be coordinated with the thickness required for the lid 3. The reduction in plate thickness can be achieved by, for example, chemical mechanical polishing (CMP). As described above, by keeping the lid wafer 30 thick until the necessity arises, easiness in handling during the manufacture is enhanced.

Segmentalization Step S36

Figure 19:
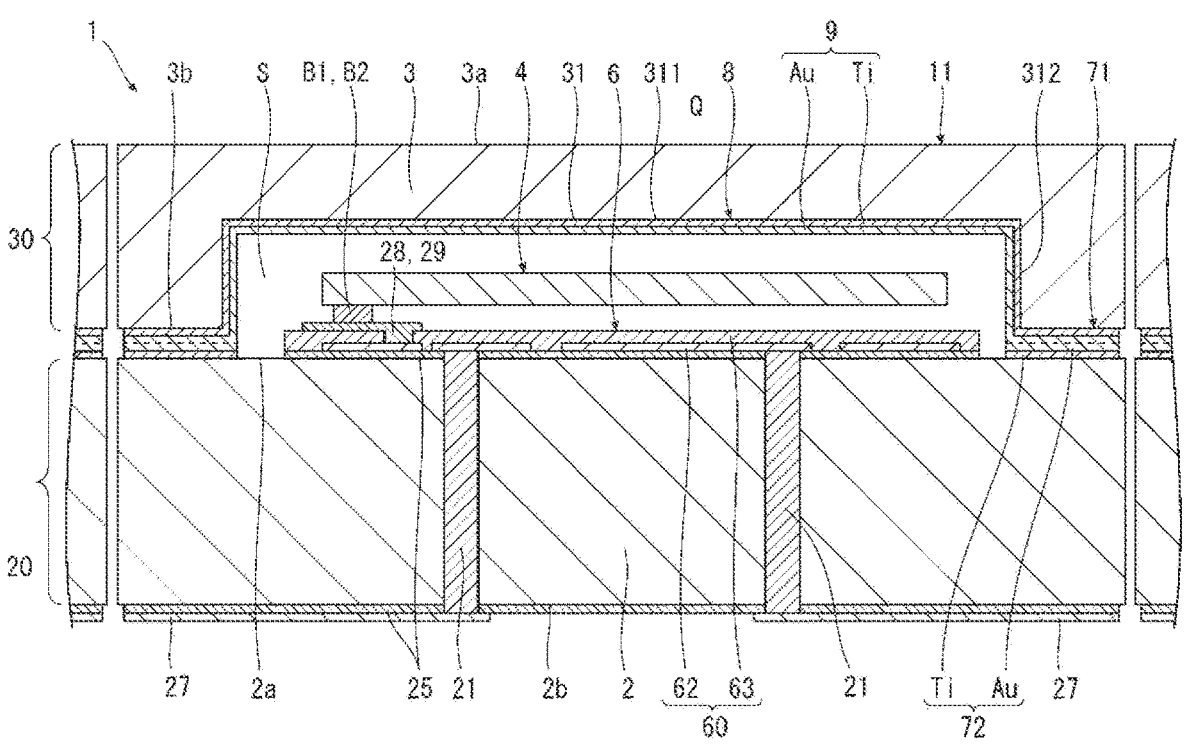
FIG. 19 is a cross-sectional view showing the method of manufacturing the resonator device.

Then, as shown in FIG. 19, a stacked body of the base wafer 20 and the lid wafer 30 is segmentalized into the segmentalization areas Q using a dicing blade or the like.

Thus, a plurality of the resonator devices 1 is formed in a lump. In particular, in the present embodiment, since the lid-side bonding layer 71, the base-side bonding layer 72, and the external terminals 27 are not arranged on the interface between the segmentalization areas Q, clogging of the dicing blade is suppressed, and thus, it is possible to smoothly and accurately perform the present step.

Annealing Step S4

Then, each of the resonator devices 1 is heated at the temperature in a range no lower than 200° C. and no higher than 300° C. to perform an annealing treatment. Thus, the diffusion of the titanium atoms to the Au layer is promoted, and thus, it is possible to enhance the gas adsorption capability of the getter layer 8. Therefore, it is possible to increase a degree of vacuum in the housing part S.

The resonator element 1 can be manufactured through the steps described above. According to such a manufacturing method, it is possible to increase the surface area of the getter layer 8 without increasing the chip size of the reso- nator device 1. Therefore, there can be obtained the reso- nator device 1 which has a high gas adsorption capability while being small in size, which is capable of increasing the degree of vacuum in the housing part S, and at the same time, capable of effectively preventing a decrease in the degree of vacuum with time.

As described above, such a method of manufacturing the resonator device 1 is a method of manufacturing the reso- nator device 1 having the base 2 which is made of silicon, and which is provided with the upper surface 2a as the first surface and the lower surface 2b as the second surface wherein the upper surface 2a and the lower surface 2b are in the front-back relationship with each other, the resonator element 4 which is arranged on the upper surface 2a, the lid 3 which is made of silicon, and which is provided with the lower surface 3b as the third surface arranged at the upper surface 2a side and faced to the upper surface 2a, and the recessed part 31 having the bottom, and opening on the lower surface 3b, and in which the lower surface 3b is bonded to the upper surface 2a, and the getter layer 8 arranged on the bottom surface 311 of the recessed part 31 and provided with the gas adsorptive property, and includes the recessed part formation step S11 of forming the recessed part 31 provided with the bottom surface 311 higher in surface roughness Ra than the lower surface 3b, the getter layer formation step S12 of forming the getter layer 8 on the bottom surface 311 of the recessed part 31, and the bonding step S3 of bonding the lower surface 3b of the lid 3 to the upper surface 2a of the base 2. According to such a manu- facturing method, it is possible to increase the surface area of the getter layer 8 without increasing the chip size of the resonator device 1. Therefore, there can be obtained the resonator device 1 which has a high gas adsorption capa- bility while being small in size, which is capable of increas- ing the degree of vacuum in the housing part S, and at the same time, capable of effectively preventing a decrease in the degree of vacuum with time.

Further, as described above, in the recessed part formation step S11, the recessed part 31 is formed using the metal- assisted chemical etching. According to the metal-assisted chemical etching, it is possible to more surely form the recessed part 31 provided with the bottom surface 311 higher in surface roughness Ra than the lower surface 3b. Therefore, for example, a treatment of roughening surfaces such as a blast treatment becomes unnecessary after the etching processing, and it is possible to achieve reduction in formation step of the recessed part 31.

Further, as described above, in the getter layer formation step S12, the Ti layer is deposited on the bottom surface 311, and the Au layer is deposited on the Ti layer. Thus, the configuration of the getter layer 8 is simplified. Further, it becomes easy to integrally form the getter layer 8 and the lid-side bonding layer 71 with each other.

Further, as described above, the thickness of the Au layer is made no larger than 100 nm. Thus, it is possible to more surely perform bonding to the base 2 in the lid-side bonding layer 71, and at the same time, it becomes easy for the titanium atoms to be diffused in the getter layer 8 up to the surface of the Au layer, and thus, it is possible to exert an excellent gas adsorptive property.

Further, as described above, in the bonding step S3, the lid-side bonding layer 71 arranged on the lower surface 3b and the base-side bonding layer 72 arranged on the upper surface 2a are bonded to each other. Thus, it is possible to firmly bond the base 2 and the lid 3 to each other.

Further, as described above, the getter layer 8 and the lid-side bonding layer 71 are the same in configuration as each other. Thus, it is possible to integrally form the getter layer 8 and the lid-side bonding layer 71 with each other.

Further, as described above, the lower surface 3b and the upper surface 2a are each lower in surface roughness Ra than 5 nm. Thus, it is possible to make the surfaces of the lid-side bonding layer 71 and the base-side bonding layer 72 sufficiently smooth. Therefore, it is possible to achieve an increase in bonding strength between the lid 3 and the base 2.

Further, as described above, after the bonding step S3, there is further included the annealing step S4 of heating a bonded body of the base 2 and the lid 3. Thus, the residual gases are adsorbed by the getter layer 8, and thus, it is possible to increase the degree of vacuum in the housing part S. Further, the diffusion of the titanium atoms to the Au layer is promoted by heating, and thus, it is also possible to enhance the gas adsorption capability of the getter layer 8.

Although the resonator device and the method of manu- facturing the resonator device according to the present disclosure are hereinabove described based on the illustrated embodiment, the present disclosure is not limited to the embodiment, but the configuration of each of the compo- nents can be replaced with one having substantially the same function and an arbitrary configuration. Further, the present disclosure can also be added with any other constituents. Further, it is also possible to arbitrarily combine any of the embodiments with each other.

What is claimed is:

1. A resonator device comprising:

a base made of silicon and provided with a first surface and a second surface in a front-back relationship with each other;

a resonator element arranged on the first surface;

a lid which is made of silicon, which has a third surface arranged at the first surface side to be faced to the first surface, and a recessed part having a bottom surface and opening on the third surface, and the third surface of which is bonded to the first surface; and a getter layer which is arranged on the bottom surface of the recessed part, and which is provided with a gas adsorptive property, wherein the bottom surface of the recessed part is higher in surface roughness Ra than the third surface.

2. The resonator device according to claim 1, wherein

The surface roughness Ra of the bottom surface of the recessed part is higher than 200 nm.

3. The resonator device according to claim 1, wherein the getter layer has a Ti layer arranged on the bottom surface and an Au layer arranged on the Ti layer.

4. The resonator device according to claim 3, wherein a thickness of the Au layer is no larger than 100 nm.

5. The resonator device according to claim 1, further comprising:

a lid-side bonding layer which is arranged on the third surface, and which is used for bonding to the base, wherein the getter layer and the lid-side bonding layer are the same in configuration as each other.

6. The resonator device according to claim 1, wherein the surface roughness Ra of the third surface is lower than 5 nm.

7. A method of manufacturing a resonator device having a base made of silicon and provided with a first surface and a second surface in a front-back relationship with each other, a resonator element arranged on the first surface, a lid which is made of silicon, which has a third surface arranged at the first surface side to be faced to the first surface, and a recessed part having a bottom surface and opening on the third surface, and the third surface of which is bonded to the first surface, and a getter layer which is arranged on the bottom surface of the recessed part, and which is provided with a gas adsorptive property, the method comprising:

a recessed part formation step of forming the recessed part provided with the bottom surface higher in surface roughness Ra than the third surface;

a getter layer formation step of forming the getter layer on the bottom surface of the recessed part; and a bonding step of bonding the third surface of the lid to the first surface of the base.

8. The method of manufacturing the resonator device according to claim 7, wherein the recessed part is formed using metal-assisted chemical etching in the recessed part formation step.

9. The method of manufacturing the resonator device according to claim 7, wherein a Ti layer is deposited on the bottom surface, and an Au layer is deposited on the Ti layer in the getter layer formation step.

10. The method of manufacturing the resonator device according to claim 9, wherein a thickness of the Au layer is made no larger than 100 nm.

11. The method of manufacturing the resonator device according to claim 7, wherein the lid-side bonding layer arranged on the third surface and the base-side bonding layer arranged on the first surface are bonded to each other in the bonding step.

12. The method of manufacturing the resonator device according to claim 11, wherein the getter layer and the lid-side bonding layer are the same in configuration as each other.

13. The method of manufacturing the resonator device according to claim 11, wherein the third surface and the first surface are each lower in the surface roughness Ra than 5 nm.

14. The method of manufacturing the resonator device according to claim 7, further comprising:

an annealing step of heating a bonded body of the base and the lid after the bonding step.

* * * * *